(12) United States Patent
Lee et al.

(10) Patent No.: US 9,592,570 B2
(45) Date of Patent: Mar. 14, 2017

(54) LASER PROCESSING APPARATUS

(71) Applicants: Samsung Display Co., Ltd., Yongin, Gyeonggi-Do (KR); Fraunhofer-Gesellschaft zur Forderung der angewandten Forschung e.V., Munich (DE)

(72) Inventors: Doh-Hyoung Lee, Yongin (KR); Choong-Ho Lee, Yongin (KR); Sung-Sik Yun, Yongin (KR); Tong-Jin Park, Yongin (KR); Arnold Gillner, Roetgen (DE); Nelli Hambach, Aachen (DE); Stephan Eifel, Cologne (DE); Jens Holtkamp, Wassenberg (DE); Lasse Büsing, Aachen (DE); Alexander Gatej, Karlsruhe (DE)

(73) Assignees: Samsung Display Co., Ltd., Samsung-ro, Giheung-Gu, Yongin-si, Gyeonggi-Do (KR); FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 337 days.

(21) Appl. No.: 13/919,641

(22) Filed: Jun. 17, 2013

(65) Prior Publication Data

US 2014/0076869 A1    Mar. 20, 2014

(30) Foreign Application Priority Data

Sep. 17, 2012    (KR) ........................ 10-2012-0102875

(51) Int. Cl.
*B23K 26/067*    (2006.01)
*B23K 26/073*    (2006.01)
(Continued)

(52) U.S. Cl.
CPC .......... *B23K 26/0676* (2013.01); *B23K 26/06* (2013.01); *B23K 26/064* (2015.10);
(Continued)

(58) Field of Classification Search
CPC .. B23K 26/06; B23K 26/067; B23K 26/0673; B23K 26/064; B23K 26/36; G02B 27/09
(Continued)

(56) References Cited

U.S. PATENT DOCUMENTS 6,636,293 B1 * 10/2003 Shiraishi ................. G03F 7/201
355/53
7,521,649 B2    4/2009 Umetsu et al.
(Continued)

FOREIGN PATENT DOCUMENTS

| CN | 1585684 | 2/2005 |
|---|---|---|
| CN | 102151986 | 8/2011 |

(Continued)

*Primary Examiner* — Samuel M Heinrich
(74) *Attorney, Agent, or Firm* — Robert E. Bushnell, Esq.

(57) ABSTRACT

A laser processing apparatus includes a laser generator for generating laser beams, a diffraction optic element for dividing the laser beam generated by the laser generator into a plurality of sub-laser beams, and a beam number controller for controlling the number of the plurality of sub-laser beams. Accordingly, the diffractive optic element that splits a laser beam generated by the laser beam generator into a plurality of sub-laser beams and the beam number controller that controls the number of sub-laser beams are provided so that the processing speed of a processing target can be improved and, at the same time, the number of laser beams can be promptly controlled, thereby promptly forming various patterns of the processing target.

14 Claims, 7 Drawing Sheets

(51) Int. Cl.
*B23K 26/06* (2014.01)
*B23K 26/36* (2014.01)
*G02B 27/09* (2006.01)
*C23C 14/04* (2006.01)
*B23K 26/40* (2014.01)

(52) U.S. Cl.
CPC ........ *B23K 26/066* (2015.10); *B23K 26/0624* (2015.10); *B23K 26/0648* (2013.01); *B23K 26/0652* (2013.01); *B23K 26/073* (2013.01); *B23K 26/36* (2013.01); *B23K 26/362* (2013.01); *B23K 26/402* (2013.01); *C23C 14/042* (2013.01); *G02B 27/09* (2013.01); *B23K 2201/40* (2013.01); *B23K 2203/30* (2015.10)

(58) Field of Classification Search
USPC ............ 219/121.61, 121.68, 121.69, 121.76, 219/121.77; 359/557, 227, 618
See application file for complete search history.

(56) References Cited

U.S. PATENT DOCUMENTS

| | | | | |
|---|---|---|---|---|
| 7,935,941 B2 * | 5/2011 | Bruland | ............... | B23K 26/067 438/463 |
| 2001/0043321 A1 * | 11/2001 | Nishi | ................. | G03F 7/70058 355/67 |
| 2003/0102291 A1 | 6/2003 | Liu et al. | | |
| 2004/0226929 A1 * | 11/2004 | Miura | ................... | B41M 3/006 219/121.85 |
| 2004/0262275 A1 | 12/2004 | Kuroiwa et al. | | |
| 2005/0061981 A1 * | 3/2005 | Allen | .................... | G01J 1/4257 250/363 |
| 2005/0141810 A1 * | 6/2005 | Vaez-Iravani | .......... | G02B 27/48 385/33 |
| 2006/0000816 A1 | 1/2006 | Hogan | | |
| 2006/0086898 A1 | 4/2006 | Cheng et al. | | |
| 2007/0189664 A1 * | 8/2007 | Andersen | ............. | A61B 3/0008 385/25 |
| 2008/0105665 A1 | 5/2008 | Kondo | | |
| 2008/0110868 A1 | 5/2008 | Morikazu et al. | | |
| 2008/0290078 A1 | 11/2008 | Nomaru et al. | | |
| 2011/0266266 A1 | 11/2011 | Kondo | | |

FOREIGN PATENT DOCUMENTS

| | | |
|---|---|---|
| DE | 102008008580 | 5/2009 |
| EP | 1063048 | 12/2000 |
| EP | 1145797 | 10/2001 |
| EP | 1779961 | 5/2007 |
| JP | 402259435 A * | 10/1990 |
| JP | 3988733 | 7/2007 |
| JP | 2008-518278 | 5/2008 |
| JP | 4593671 | 12/2010 |
| KR | 10-2005-0083421 | 8/2005 |
| KR | 10-2006-0055941 | 5/2006 |
| KR | 10-0935809 | 12/2009 |
| WO | 98/48451 | 10/1998 |
| WO | 02/05345 | 1/2002 |
| WO | 2011116968 | 9/2011 |

* cited by examiner

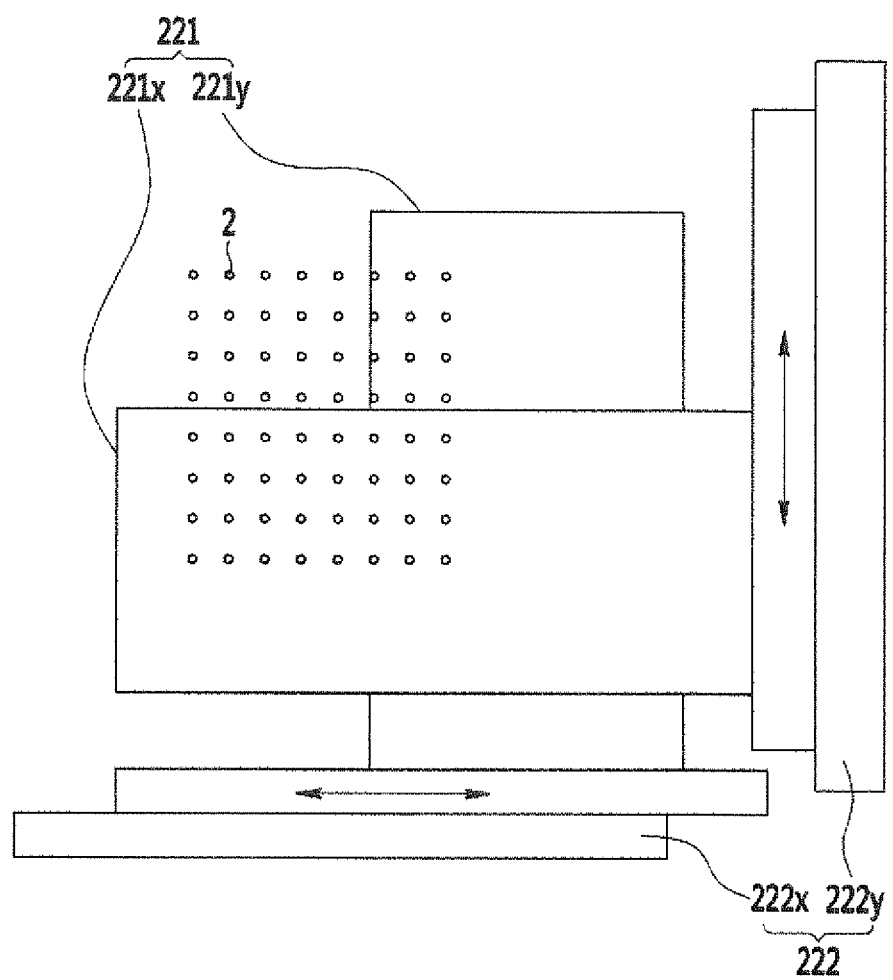

LASER PROCESSING APPARATUS

CLAIM OF PRIORITY

This application makes reference to, incorporates the same herein, and claims all benefits accruing under 35 U.S.C. §119 from an application earlier filed in the Korean Intellectual Property Office on the 17 Sep. 2012 and there duly assigned Serial No. 10-2012-0102875.

BACKGROUND OF THE INVENTION

Field of the Invention

The present invention relates to a laser processing apparatus, and more specifically to a laser processing apparatus which can control the number of laser beams.

Description of the Related Art

As a method for manufacturing a shadow mask for deposition of an organic material of an organic light emitting diode (OLED) display, a wet etching method has been used. However, when the wet etching method is used for manufacturing the shadow mask, the shadow mask may not have exquisite patterns due to non-uniformity from the wet etching, and the shadow mask cannot have a wide deposition angle because a side shape of the pattern is formed in a given shape. In addition, when a large-scale shadow mask is manufactured, the thickness of a steel plate is increased due to a limit in rolling technology, and the patterns become non-uniform because the wet etching time is increased.

To solve such problems in the wet etching, a method for manufacturing a shadow using a laser processing apparatus has been devised to manufacture a large-scale shadow mask having exquisite patterns and a standard side angle. However, when a single laser beam is used for manufacturing the shadow mask using the laser processing apparatus, manufacturing time is increased, and when the single laser beam is divided into a plurality of laser beams by a diffractive optical element (DOE), the number of laser beams is fixed so that the size of the shadow mask may not vary. In order to manufacture various sizes of shadow masks, the number of laser beams may be controlled by changing the diffractive optical element, but in this case, the diffractive optical element should be changed each time in order to split the laser beam into various numbers of laser beams so that shadow mask processing time is increased and manufacturing cost is also increased.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide a laser processing apparatus that can promptly control the number of laser beams.

A laser processing apparatus according to an exemplary embodiment of the present invention may include a laser generator generating laser beams, a diffraction optic element dividing the laser beam generated from the laser generator into a plurality of sub-laser beams, and a beam number controller controlling the number of sub-laser beams.

The beam number controller may include a beam blocking device partially blocking the plurality of sub-laser beams and a location controller controlling a location of the beam blocking device.

The location controller may include a horizontal location controller controlling a horizontal location of the beam blocking device and a vertical location controller controlling a vertical location of the beam blocking device.

The beam blocking device may include a horizontal blocking unit and a vertical blocking unit that is perpendicular to the horizontal blocking unit.

The vertical blocking unit may be connected to an end of the horizontal blocking unit.

The beam blocking device may be formed in the shape of an "L".

The laser processing apparatus may further include a connection unit that connects the horizontal location controller and the vertical location controller.

The vertical location controller may be connected to the vertical blocking unit.

The horizontal location controller may be connected to the horizontal blocking unit.

The horizontal blocking unit and the vertical blocking unit may be separated from each other, the horizontal location controller may be connected to the vertical blocking unit, and the vertical location controller may be connected to the horizontal blocking unit.

The laser processing apparatus may further include an aberration correction optical system for correcting an aberration that depends on a relative location between the plurality of sub-laser beams.

The aberration correction optical system may include a first aberration correction optical system disposed in a front of the beam number controller in a movement path of the sub-laser beams and a second aberration correction optical system disposed at the rear of the beam number controller in the movement path of the sub-laser beams.

The laser processing apparatus may further include a high-order beam block mask for eliminating a high-order sub-laser beam among the plurality of sub-laser beams.

The laser processing apparatus may further include a beam expender disposed in front of the diffraction optic element and inputting laser beams of uniform intensity to the diffraction optic element.

According to the present invention, a diffractive optic element that splits a laser beam generated from a laser beam into a plurality of sub-laser beams and a beam number controller that controls the number of sub-laser beams are provided so that the processing speed of a processing target can be improved and, at the same time, the number of laser beams can be promptly controlled, thereby promptly forming various patterns of the processing target.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 7 is a front view of a beam number controller of a laser processing apparatus according to a third exemplary embodiment of the present invention.

DETAILED DESCRIPTION OF THE INVENTION

Figure 1:
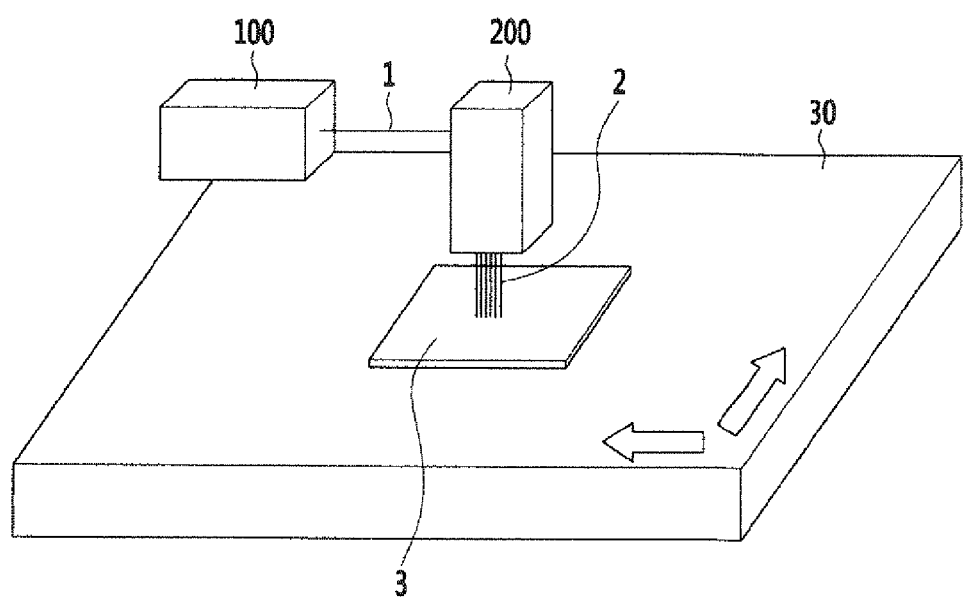
FIG. 1 is a schematic diagram of a laser processing apparatus according to a first exemplary embodiment of the present invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

Then, a laser processing apparatus according to a first exemplary embodiment of the present invention will be described in further detail with reference to FIG. 1 to FIG. 4.

Figure 2:
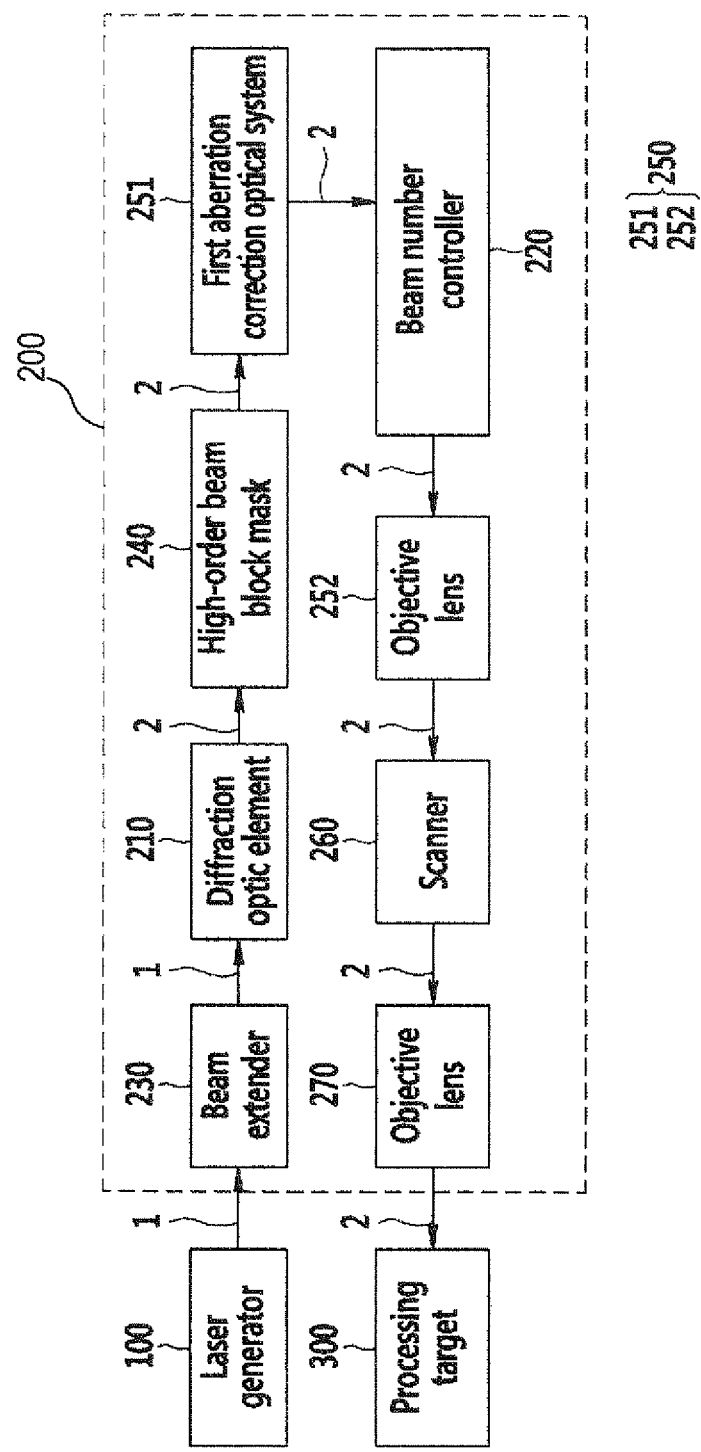
FIG. 2 is a block diagram of the laser processing apparatus according to the first exemplary embodiment of the present invention.
Figure 3:
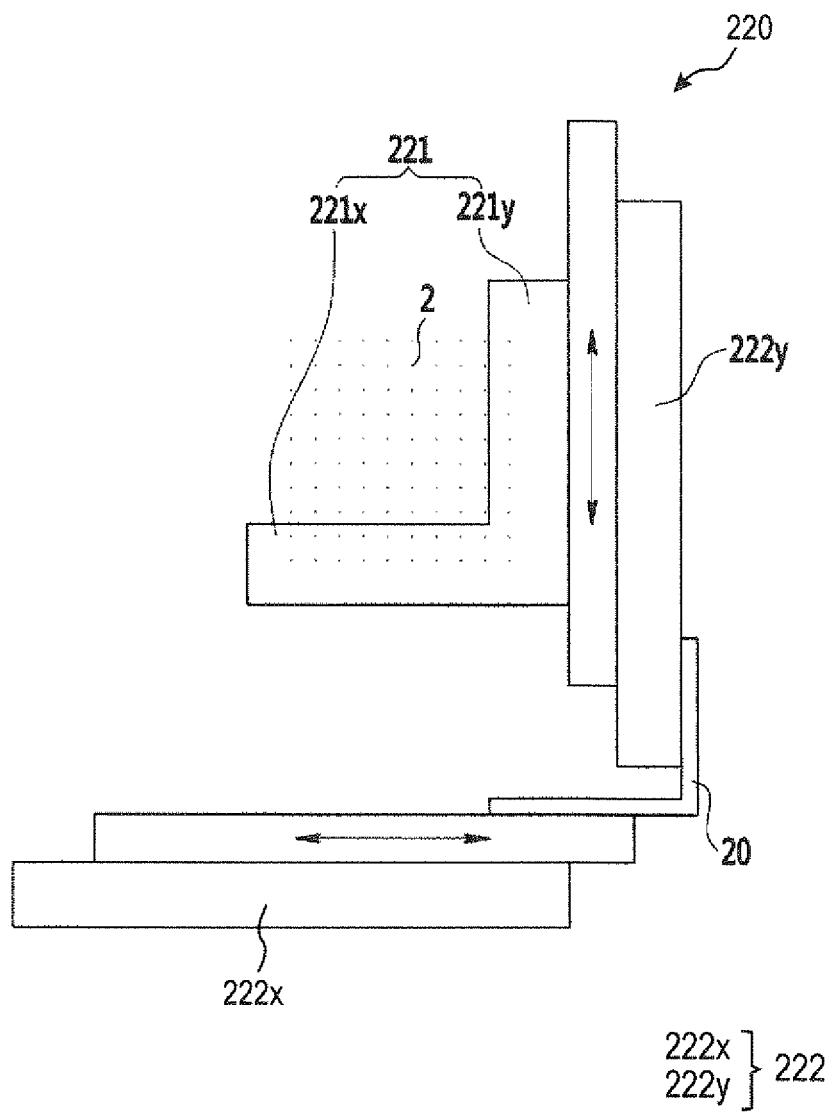
FIG. 3 is a front view of a beam number controller of FIG. 2.
Figure 4:
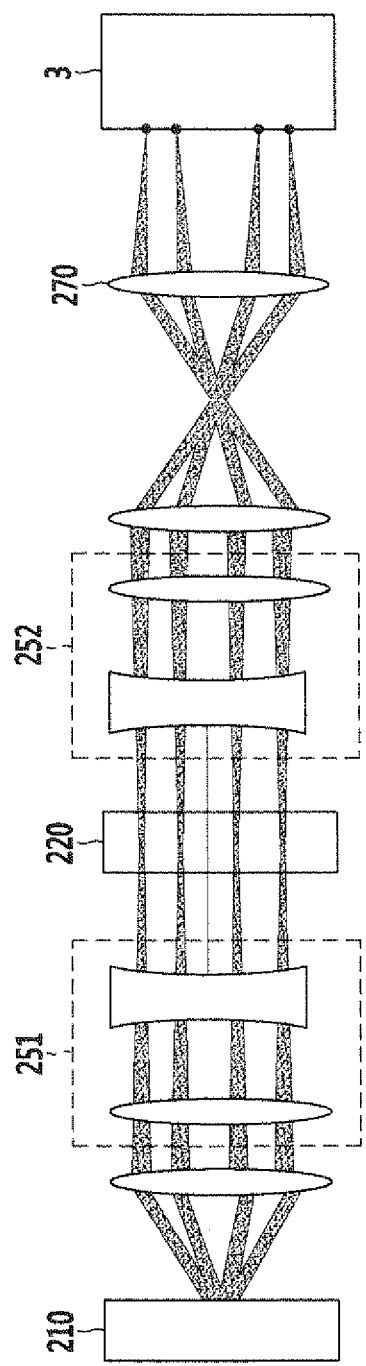
FIG. 4 is a descriptive view of an aberration correction optical system of FIG. 2.

FIG. 1 is a schematic diagram of the laser processing apparatus according to the first exemplary embodiment of the present invention, FIG. 2 is a block diagram of the laser processing apparatus according to the first exemplary embodiment of the present invention, FIG. 3 is a front view of a beam number controller of FIG. 2, and FIG. 4 is a descriptive view of an aberration correction optical system of FIG. 2.

As shown in FIG. 1 and FIG. 2, the laser processing apparatus includes a laser generator 100 generating a laser beam 1, a beam splitting optical system 200 for controlling the number of sub-laser beams 2 by dividing the laser beam 1 into a plurality of sub-laser beams 2, and a stage 300 to which a processing target 3 processed with the laser beam 1 is mounted and controlling a location of the processing target 3.

The processing target 3 may be a shadow mask for deposition of an organic material of an OLED display.

The laser generator 100 may be a pico second laser generator or a femto second-to-micro second laser generator. The pico second laser generator minimizes thermal transmission and thermal distortion to the periphery area of a laser processing area in the processing target 3 using a pulse of several pico seconds to process a high-precision shape, that is, a shape having a 2 micrometer or less error.

The beam splitting optical system 200 includes a diffraction optic element 210 for dividing the laser beam 1 generated from the laser generator 100 into a plurality of sub-laser beams 2, and a beam number controller 220 for controlling the number of the plurality of sub-laser beams 2.

In addition, the beam splitting optical system 200 further includes a beam expender 230 disposed in a front of the diffraction optic element 210, a high-order beam block mask 240 for eliminating a high-order sub-laser beam among the plurality of sub-laser beams 2, an aberration correction optical system 250 for correcting an aberration according to a relative location between the plurality of sub-laser beams 2, a scanner 260 for changing a movement path of the sub-laser beams 2, and an objective lens 270 disposed in a front of the processing target 3 and locating a focus of the plurality of sub-laser beams 2 to the surface of the processing target 3.

The beam expender 230 expends the laser beam 1 and inputs the laser beam 1 having uniform intensity to an input section of the diffraction optic element 210.

The diffraction optic element 210 includes a diffractive grating, and divides the laser beam 1 into the plurality of sub-laser beams 2 using diffraction.

The high-order beam block mask 240 eliminates a high-order sub-laser beam 2 unnecessarily generated by the diffraction optic element 210, and may be provided in any place on the movement path of the sub-laser beams 2. That is, the high-order beam block mask 240 can be disposed in any place, except for a rear side of the diffraction optic element 210.

As shown in FIG. 3, the beam number controller 220 includes a beam blocking device 221 for partially blocking the plurality of sub-laser beams 2 and a location controller 222 for controlling a location of the beam blocking device 221.

The beam blocking device 221 includes a horizontal blocking unit 221x and a vertical blocking unit 221y that is perpendicular to the horizontal blocking unit 221x. The vertical blocking unit 221y is connected to an end of the horizontal blocking unit 221x, and the beam blocking device 221 is formed in the shape of an "L". Since a sub-laser beam 2 that is not blocked by the horizontal blocking unit 221x and the vertical blocking unit 221y among the plurality of sub-laser beams 2 passes through the beam blocking device 221, the beam blocking device 221 can control the number of the sub-laser beams 2.

The location controller 222 includes a horizontal location controller 222x for controlling a horizontal location of the beam blocking device 221, a vertical location controller 222y for controlling a vertical location of the beam blocking device 221, and a connection unit 20 for connecting the horizontal location controller 222x and the vertical location controller 222y. The vertical location controller 222y is directly connected to the vertical blocking unit 221y, and the horizontal location controller 222x is separated from the horizontal blocking unit 221x. Since the horizontal location controller 222x is connected to the vertical location controller 222y through the connection unit 20, the horizontal location of the horizontal blocking unit 221x can be controlled using the horizontal location controller 222x.

In the horizontal location controller 222x and the vertical location controller 222y, two bar-shaped members slide with respect to each other by a piezoelectric method. A piezoelectric material is expanded slowly, contracted fast or slow, and then expanded fast so that the bar-shaped members move.

In the exemplary embodiment of the present invention, the horizontal location controller 222x and the vertical location controller 222y are described as a piezoelectric location controller, but the present invention is not limited thereto. That is, another type of motor driver is applicable.

As described, the location of the beam blocking device 221 is controlled using the location controller 222, and thus the number of the sub-laser beams 2 blocked by the beam blocking device 221 can be promptly changed. Therefore, cost and time for manufacturing the shadow mask, which is the processing target 3, can be reduced.

In addition, since the number of matrixes of the plurality of sub-laser beams 2 can be controlled using the beam number controller 220, mask openings 3 at the periphery of the shadow mask 3 can be promptly processed.

Figure 5:
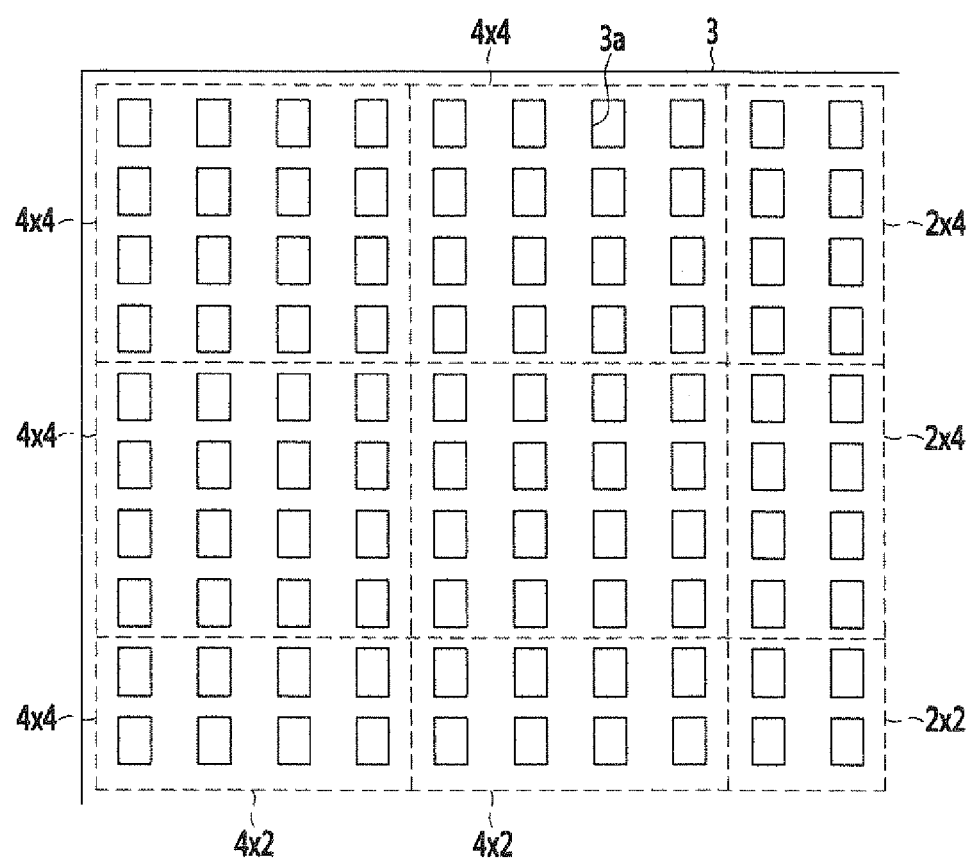
FIG. 5 is a diagram provided for description of a detailed exemplary usage of the beam number controller of FIG. 2.

FIG. 5 is a diagram provided for description of a detailed exemplary usage of the beam number controller of FIG. 2.

A full-HD display device includes millions of pixels, and thus, the plurality of sub-laser beams 2 divided by the diffraction optic element 210 are used to promptly manufacture the shadow mask 3 having a number of mask openings 3a respectively corresponding to the pixels. However, a problem occurs in the processing when the number of mask openings 3a of the shadow mask 3 is not an integer times the sub-laser beams 2.

For example, as shown in FIG. 5, when the number of mask openings 3a of the shadow mask 3 to be processed is 4×4, it is difficult to process 10×10 mask openings 3a with 4×4 sub-laser beams 2. That is, 4×2, 2×4, and 2×2 sub-laser beams 2 are required.

However, the 4×4 sub-laser beams 2 can be promptly changed to the 4×2, 2×4, and 2×2 sub-laser beams 2 using the beam number controller 220 of the laser processing apparatus according to the first exemplary embodiment of the present invention.

In addition, since 4×1 or 1×4 straight-lined sub-laser beams 2 can be formed using the beam number controller 220, the sub-laser beams 2 can be utilized in cutting the edge of the shadow mask 3 after processing the mask openings 3a using the laser processing apparatus.

Meanwhile, as shown in FIG. 4, the aberration correction optical system 250 reduces an aberration that depends on a relative location between the plurality of sub-laser beams 2 to form focuses of the entire sub-laser beams 2 on the surface of the processing target 3. The aberration correction optical system 250 includes a first aberration correction optical system 251 disposed in a front of the beam number controller 220 in the movement path of the sub-laser beams 2 and a second aberration correction optical system 252 disposed in a rear of the beam number controller 220 in the movement path of the sub-laser beams 2.

Since the beam number controller 220 is located where the focuses of the plurality of sub-laser beams 2 are formed, the beam number controller 220 can partially block the plurality of sub-laser beams 2 with ease and pass others. As shown in FIG. 4, the focuses of the plurality of sub-laser beams 2 are formed between the first aberration correction optical system 251 and the second aberration correction optical system 252, and therefore the beam blocking device 221 (FIG. 3) of the beam number controller 220 (FIG. 4) is located between the first aberration correction optical system 251 and the second aberration correction optical system 252.

The scanner 260 of FIG. 2 can easily draw the opening of the shadow mask to the processing target 3 by promptly changing the movement path of the sub-laser beams 2.

Although the vertical location controller 222y (FIG. 3) is directly connected to the vertical blocking unit 221y in the first exemplary embodiment, the horizontal location controller 222x may be directly connected to the horizontal blocking unit 221x in a second exemplary embodiment.

Hereinafter, a laser processing apparatus according to a second exemplary embodiment of the present invention will be described with reference to FIG. 6.

Figure 6:
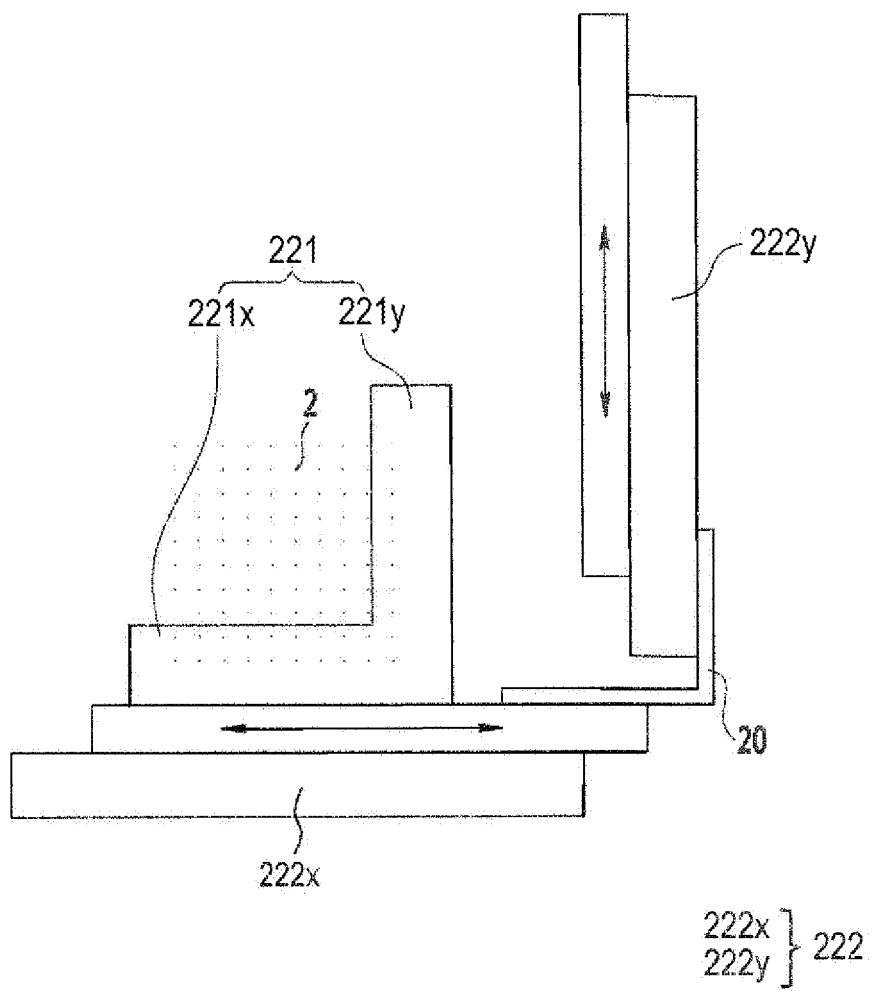
FIG. 6 is a front view of a beam number controller of a laser processing apparatus according to a second exemplary embodiment of the present invention.

FIG. 6 is a front view of a beam number controller of the laser processing apparatus according to a second exemplary embodiment of the present invention.

The second exemplary embodiment is substantially the same as the first exemplary embodiment, except for the structure of the beam number controller, and therefore a repeated description thereof will be omitted.

As shown in FIG. 6, the beam number controller of the laser processing apparatus according to the second exemplary embodiment of the present invention includes a beam blocking device 221 for partially blocking a plurality of sub-laser beams 2 and a location controller 222 for controlling a location of the beam blocking device 221. The beam blocking device 221 includes a horizontal blocking unit 221x and a vertical blocking unit 221y that is perpendicular to the horizontal blocking unit 221x. The vertical blocking unit 221y is connected to an end of the horizontal blocking unit 221x, and the beam blocking device 221 is formed in the shape of an "L".

The location controller 222 includes a horizontal location controller 222x for controlling a horizontal location of the beam blocking device 221, a vertical location controller 222y for controlling a vertical location of the beam blocking device 221, and a connection unit 20 for connecting the horizontal location controller 222x and the vertical location controller 222y. The horizontal location controller 222x is directly connected to the horizontal blocking unit 221x and the vertical location controller 222y is separated from the vertical blocking unit 221y. Since the vertical location controller 222y is connected to the horizontal location controller 222x through the connection unit 20, the vertical location of the vertical blocking unit 221y can be controlled using the vertical location controller 222y. As described, the number of sub-laser beams 2 blocked by the beam blocking device 221 can be promptly changed by controlling the location of the beam blocking device 221 with the location controller 222. Accordingly, cost and time for manufacturing a shadow mask, which is a processing target 3, can be reduced.

In the first exemplary embodiment, the vertical blocking unit is connected to the end of the horizontal blocking unit, and thus the vertical blocking unit and the horizontal blocking unit move together, but the horizontal blocking unit and the vertical blocking unit may be separated from each other in a third exemplary embodiment.

Hereinafter, a laser processing apparatus according to the third exemplary embodiment of the present invention will be described with reference to FIG. 7.

FIG. 7 is a front view of a beam number controller of a laser processing apparatus according to a third exemplary embodiment of the present invention.

The third exemplary embodiment is substantially the same as the first exemplary embodiment, except for the structure of the beam number controller, and therefore a repeated description thereof will be omitted.

As shown in FIG. 7, the beam number controller of the laser processing apparatus according to the third exemplary embodiment of the present invention includes a beam blocking device 221 for partially blocking a plurality of sub-laser beams 2 and a location controller 222 for controlling a location of the beam blocking device 221.

The beam blocking device 221 includes a horizontal blocking unit 221x and a vertical blocking unit 221y that is perpendicular to the horizontal blocking unit 221x, and the horizontal blocking unit 221x and the vertical blocking unit 221y are separated from each other.

The location controller 222 includes a horizontal location controller 222x for controlling a horizontal location of the beam blocking device 221 and a vertical location controller 222y for controlling a vertical location of the beam blocking device 221. The horizontal location controller 222x is directly connected to the vertical blocking unit 221y, and the vertical location controller 222y is directly connected to the horizontal blocking unit 221x, and thus the horizontal location controller 222x can control a horizontal location of the vertical blocking unit 221y, and the vertical location controller 222y can control a vertical location of the horizontal blocking unit 221x. As described, the location of the beam blocking device 221 is controlled using the location controller 222, and thus the number of the sub-laser beams 2 blocked by the beam blocking device 221 can be promptly changed. Accordingly, cost and time for manufacturing the shadow mask, which is a processing target 3, can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A laser processing apparatus, comprising:
   a laser generator for generating a laser beam;
   a diffraction optic element for dividing the laser beam generated by the laser generator into a plurality of sub-laser beams; and
   a beam number controller comprising a beam blocking device and a location controller, the location controller adjusting a geometrical location of the beam blocking device to block at least one of the plurality of sub-laser beams.

2. The laser processing apparatus of claim 1, the location controller comprising a horizontal location controller for controlling a horizontal location of the beam blocking device and a vertical location controller for controlling a vertical location of the beam blocking device.

3. The laser processing apparatus of claim 2, the beam blocking device comprising a horizontal blocking unit and a vertical blocking unit disposed perpendicular to the horizontal blocking unit.

4. The laser processing apparatus of claim 3, the vertical blocking unit being connected to an end of the horizontal blocking unit.

5. The laser processing apparatus of claim 4, the beam blocking device being formed in a shape of an "L".

6. The laser processing apparatus of claim 4, further comprising a connection unit that connects the horizontal location controller and the vertical location controller.

7. The laser processing apparatus of claim 6, the vertical location controller being connected to the vertical blocking unit.

8. The laser processing apparatus of claim 6, the horizontal location controller being connected to the horizontal blocking unit.

9. The laser processing apparatus of claim 3, the horizontal blocking unit and the vertical blocking unit being separated from each other.

10. The laser processing apparatus of claim 9, the horizontal location controller being connected to the vertical blocking unit and the vertical location controller being connected to the horizontal blocking unit.

11. The laser processing apparatus of claim 1, further comprising an aberration correction optical system for correcting an aberration that depends on a relative location between the plurality of sub-laser beams.

12. The laser processing apparatus of claim 11, the aberration correction optical system comprising a first aberration correction optical system disposed at a front of the beam number controller in a movement path of the sub-laser beams and a second aberration correction optical system disposed at a rear of the beam number controller in the movement path of the sub-laser beams.

13. The laser processing apparatus of claim 1, further comprising a high-order beam block mask for eliminating a high-order sub-laser beam among the plurality of sub-laser beams.

14. The laser processing apparatus of claim 1, further comprising a beam extender disposed at a front of the diffraction optic element for inputting laser beams of uniform intensity to the diffraction optic element.

* * * * *